United States Patent [19]

Harp et al.

[11] 4,032,865

[45] June 28, 1977

[54] RADIAL IMPEDANCE MATCHING DEVICE PACKAGE

[75] Inventors: Robert S. Harp, Westlake Village; Kenneth J. Russell, Thousand Oaks, both of Calif.

[73] Assignee: Hughes Aircraft Company, Culver City, Calif.

[22] Filed: Mar. 5, 1976

[21] Appl. No.: 664,346

[52] U.S. Cl. .................... 333/21 R; 330/56; 331/107 G; 333/34; 333/96; 333/98 R

[51] Int. Cl.² ............... H01P 1/16; H01P 5/10; H01P 1/04; H03B 9/12

[58] Field of Search .......... 333/34, 84 R, 33, 32, 333/96, 98 R, 97 R, 97 S, 21 R; 307/320; 357/81, 3, 74, 84; 331/96, 101, 107 R, 107 G, 104; 330/56

[56] References Cited

UNITED STATES PATENTS

| | | | |
|---|---|---|---|
| 3,469,209 | 9/1969 | Mosher | 357/3 |
| 3,516,017 | 6/1970 | Kaneko et al. | 357/3 X |
| 3,624,550 | 11/1971 | Vane | 331/96 |
| 3,644,843 | 2/1972 | Sigmon | 331/107 T |
| 3,701,049 | 10/1972 | Van Iperen et al. | 331/107 R |
| 3,894,895 | 7/1975 | Khandelwal | 357/81 X |
| 3,916,350 | 10/1975 | Swan | 333/32 |

Primary Examiner—Davis L. Willis
Assistant Examiner—Marvin Nussbaum
Attorney, Agent, or Firm—William J. Bethurum; W. H. MacAllister

[57] ABSTRACT

Disclosed is an active radial-to-coaxial transmission line wherein an annular configured semiconductor device, such as an IMPATT diode, is embedded in a chosen dielectric material which is in turn positioned between two conductive members forming a radial transmission line. Advantageously, the lower conductive member of the transmission line also serves as a heat sink for the diode, and the upper conductive member of the radial transmission line may be formed as a highly conductive coating which makes good ohmic contact to the diode, thereby minimizing power losses at this contact. The radial transmission line transforms the relatively low impedance of the diode to a substantially higher value at the outer periphery thereof where contact to a coaxial transmission line may be achieved with good impedance matching, thereby maximizing power transfer between the radial and coaxial transmission lines.

16 Claims, 9 Drawing Figures

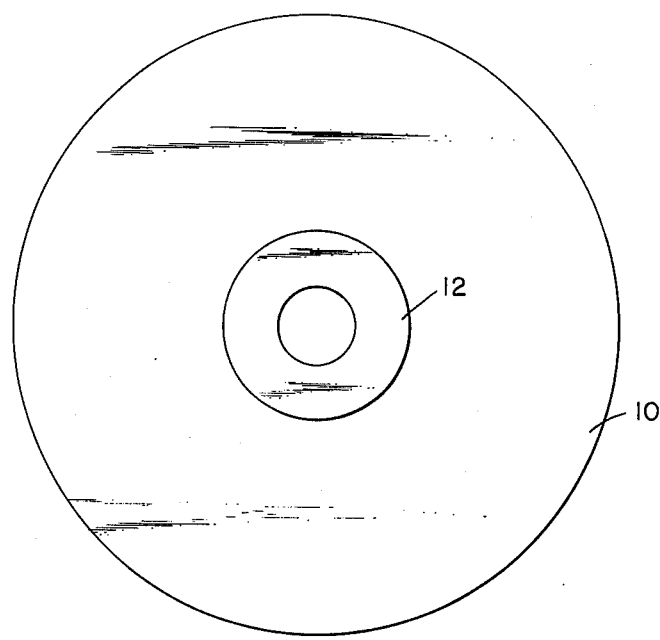
Fig. 1a.
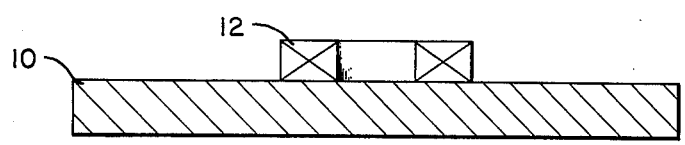
Fig. 1b.
Fig. 2.
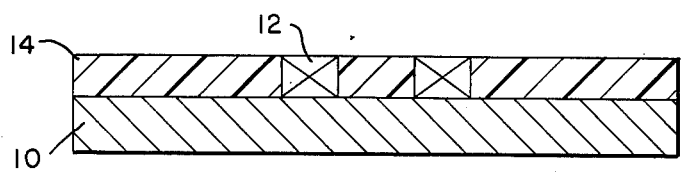
Fig. 3.
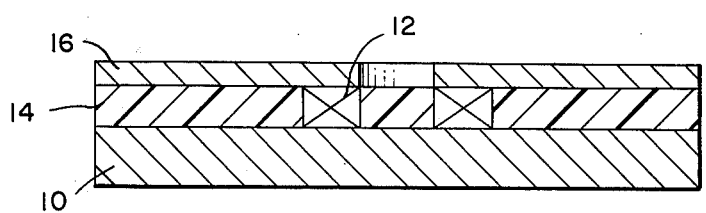
Fig. 4.
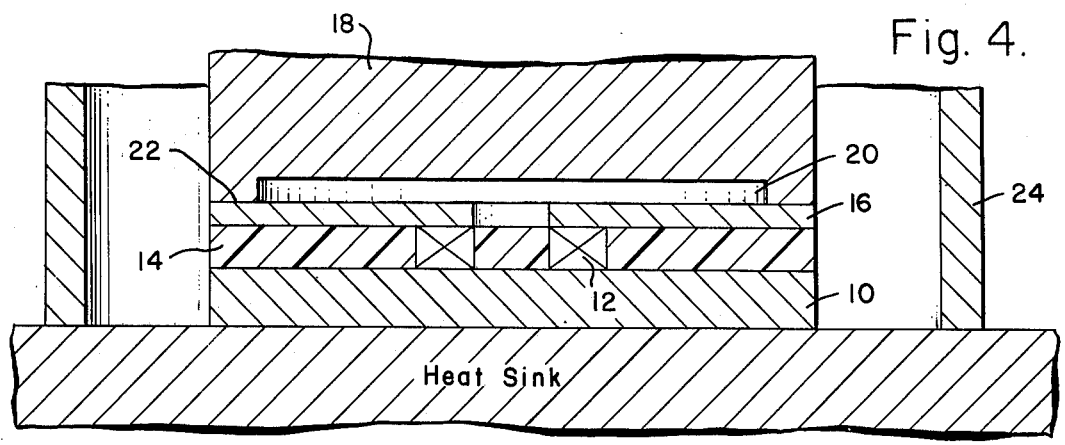

RADIAL IMPEDANCE MATCHING DEVICE PACKAGE

FIELD OF THE INVENTION

This invention relates generally to active semiconductor diode microwave circuitry and more particularly to an active transmission line arrangement including an annular semiconductor diode and characterized by improved impedance matching and power transfer characteristics.

BACKGROUND AND RELEVANT PRIOR ART

To provide optimum coupling efficiency and power transfer in the field of solid state power generation and amplification using semiconductor diodes, such as Gunn diodes and IMPATT diodes, the relatively low impedance of these semiconductor devices should be closely matched to the relatively high impedance of the wave propagating structure to which the diode is coupled. This problem becomes particularly significant as the power requirements (and thus area) of these solid state devices is increased, thereby decreasing the device impedance and increasing the device capacitance.

One common prior art technique known to us for approaching this impedance matching problem involves the use of a so called quarter wave ($\lambda/4$) impedance transformer, which is typically a solid metal cylinder having its longitudinal axis equal to approximately one quarter of the wavelength or wavelength range of interest. One end of this cylinder is bonded for ohmic contact to a semiconductor diode package, and the other end of the metal cylinder is joined to an inner conductor of a relatively high impedace coaxial line used for coupling power from the diode package to some external circuit or cavity, such as a power combining cavity. Examples of such impedance transformers are disclosed in U.S. Pat. Nos. 3,842,370 and 3,931,587, assigned to the present assignee.

The above type of impedance transforming arrangement presents several structural disadvantages which tend to reduce the coupling efficiency of circuits using the arrangement, particularly when relatively large area and thus low impedance diodes are required. First of all, since ohmic contact bonding is made between one surface of the relatively small diode package and the larger cylindrical surface of the above described quarter-wave impedance transformer, the resulting ohmic contact between these members is frequently nonuniform. Such contact or contacts frequently occur only at localized regions on the surfaces of these two abutting structures, and thereby produce high localized currents and corresponding high $I^2R$ power losses at the diode package/impedance transformer interface. It is simply difficult to make good uniform ohmic contact using this prior art approach of pressure bonding the diode package between the quarter-wave impedance transformer's end surface and a supporting heat sink for the diode which typically couples the outer coaxial conductor of the coupling structure.

Another problem which is encountered when the area of the semiconductor diodes is increased to increase their power generation capability relates to the effect that the corresponding increase in diode capacitance has on the diode package resonance. That is, as the capacitance of the diode is increased in direct proportion to its increase in area, it remains no longer resonant with the inductance of the package housing and electrical leads for the diode. This means that the total package inductance must be changed accordingly in order for it to remain substantially series resonant with the increased capacitance of the diode, an obviously desirable characteristic for achieving maximum power transfer between the diode and the external circuit to which it is coupled.

A further disadvantage of this prior art quart-wave impedance transformer approach to impedance matching between the diode and its external circuitry resides in the relatively abrupt step transformation between the low impedance of the diode and the relatively high impedance of the coaxial circuit which is only one quarter wavelength from the diode. This abrupt impedance transition is simply not consistent with good broadband circuit operation, and it therefore limits the achievable operational bandwidth of the circuit structure.

THE INVENTION

The general purpose of the present invention is to provide a novel impedance matched active transmission line which utilizes a low impedance semiconductor diode and yet eliminates the aforedescribed disadvantages of the prior art quarter-wave impedance transformer matching arrangement, while simultaneously permitting an increased area and thus increased power generation capability of the semiconductor diode. To achieve this purpose, we have discovered and developed a novel active transmission line structure wherein an annular semiconductor diode is surrounded by a substantially coplanar dielectric (or high resistivity semiconductive) layer, and both the diode and the dielectric wave propagating layer are disposed between two conductors which form, with the dielectric layer, a radial transmission line. This radial transmission line transforms the relatively low impedance of the diode to a substantially higher impedance at the periphery of this line where good impedance matching to another, coaxial transmission line may be achieved using conventional pressure contact techniques. Advantageously, the lower and supporting conductor of the radial transmission line also serves as a good heat sink for the diode, whereas the upper conductor of the radial transmission line may be provided in the form of a thin highly conductive and adherent metal layer which provides an excellent ohmic contact to the diode, and thus minimizes diode power losses at this contact.

Accordingly, it is an object of the present invention to provide a new and improved active transmission line including a large area semiconductor diode and an improved impedance matching therefor.

Another object is to provide a transmission line structural arrangement of the type desired in which conventional diode packaging requirements for devices such as Gunn and IMPATT diodes, and the like, and their associated lead inuctances and parasitic capacitances have been eliminated.

Another object is to provide an improved transmission line arrangement of the type described exhibiting excellent heat sinking and power transfer characteristics.

A feature of the present invention is the provision of a radial-to-coaxial transmission line arrangement of the type described characterized by a gradual impedance transition from the relatively low impedance of a semiconductor diode to a substantially higher impedance value of a connected coaxial transmission line, thereby imparting improved broad-band operation to the structure.

Another feature is the provision of a transmission line arrangement of the type described wherein a semiconductor diode of annular configuration is integrated directly into a radial transmission line, thereby increasing diode-to-conductor surface area relative to prior art packaged diodes and thereby enhancing the eat transfer characteristics for the diode. This feature also eliminates the necessity for providing electrical wire or ribbon-like leads and their associated packaging support members for the diode.

Another feature is the provision of a transmission line arrangement of the type described wherein the materials and geometrical configuration for the radial transmission line lend themselves to structural modifications which impart a dimension of control over the impedance matching characteristics of the transmission line.

A further feature is the provision of a transmission line arrangement of the type described wherein a thin, highly conductive and adherent layer may be vacuum evaporated or otherwise deposited such as by screening directly on an annular semiconductor diode to thereby greatly improve its ohmic contact for operating bias purposes and also to minimize power losses at this contact.

A further feature is the provision of a transmission line arrangement of the type described wherein bonding between radial and coaxial transmissions line sections occurs at a point of relatively high impedance on the radial transmission line, thereby reducing the I²R losses relative to prior art structures by a factor of 1,000 or more.

These and other objects and features of the present invention will become more readily apparent in the following description of the accompanying drawings.

DRAWINGS

FIGS. 1a and 1b illustrate, in plan and cross-section view, respectively, an annular semiconductor diode which is bonded to a plated heat sink member in an initial step of the present process.

FIG. 2 illustrates the addition of the dielectric waveguiding layer to the substructure of FIGS. 1a and 1b.

FIG. 3 illustrates the addition of an upper conductive member to the substructure of FIG. 2 in order to complete the radial transmission line section according to one embodiment of the invention.

FIG. 4 illustrates the connection of the radial transmission line section in FIG. 3 to another, coaxial transmission line section to form another embodiment of the invention.

FIG. 6b is an equivalent circuit for the radial transmission line of FIG. 6a.

FIG. 6c illustrates in schematic view a typical useful coaxial circuit application for the transmission line structure according to either of FIGS. 4 or 6a.

DESCRIPTION OF THE PREFERRED EMBODIMENT

Figure 5:
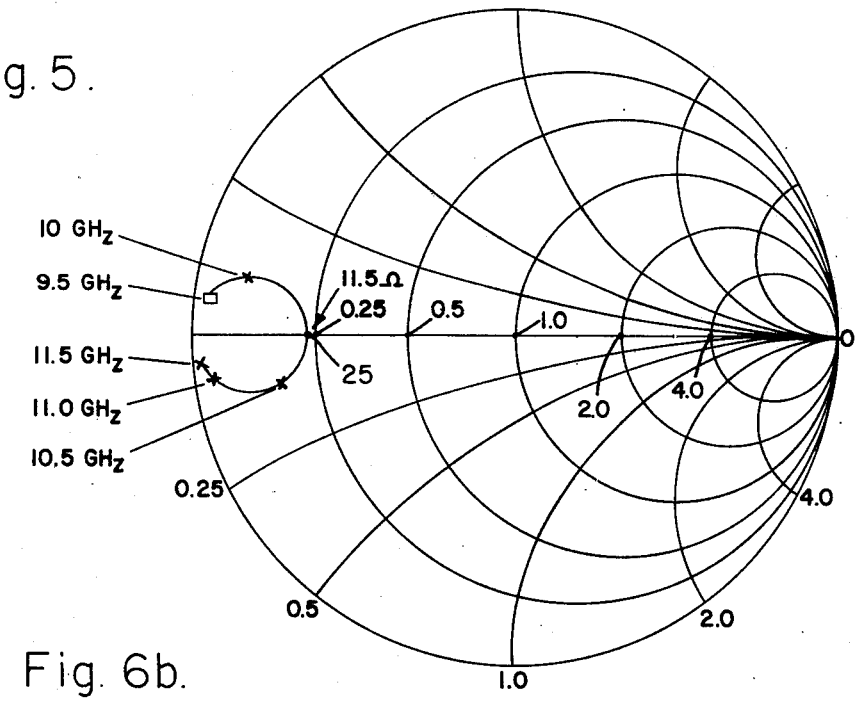
FIG. 5 is a Smith chart illustrating the operational performance of the predetermined transmission line structure of FIG. 4.

Referring now to FIGS. 1a and 1b, there is shown a plated conductive heat sink member 10, such as gold plated brass, copper, aluminum or some other good heat conductor upon which an annular ring IMPATT diode 12 is centered and bonded using conventional state of the art semiconductor-to-metal techniques. The structure shown in FIGS. 1a and 1b is transferred to a dielectric layer deposition station wherein a suitable dielectric material 14, such as an epoxy, is compressed around the exposed vertical surfaces of the annular ring diode 12 and then lapped on its upper surface and outer edges unit it is substantially coplanar with the top surface of the ring diode 12 and substantially co-extensive, as shown in FIG. 2, with the plated heat sink member 10.

Next, a second conductive member 16 is deposited, as shown in FIG. 3, on the upper surfaces of both the dielectric layer 14 and the annular ring diode 12. Advantageously, the conductive member 16 is formed by depositing a highly conductive metal, such as gold, as a thin film which makes good low resistance ohmic contact to the ring diode 12. Thus, the first and second conductors 10 and 16 are multifunctional in the sense that the first conductor 10 also provides good heat sinking for the ring diode 12, whereas the second conductor 16 provides excellent ohmic contact to the ring diode 12 in addition to functioning as part of a radial transmission line.

The radial transmission line structure of FIG. 3 serves to transform the relatively low impedance of the ring diode 12, which may typically be on the order of 0.3 ohms, to an impedance value on the order of about 11.5 ohms at the outer periphery of the radial transmission line. The characteristic impedance of the radial transmission line formed by the top conducting layer 16, the dielectric layer 14 and the plated heat sink 10 can be varied by changing the thickness of the dielectric layer 16 and/or the type of dielectric material used. The characteristic impedance of this radial transmission line varies directly with the ratio of W/R, where W is the thickness of the dielectric layer 16 and R is a radial position in the transmission line from its central axis through the geometrical center of the ring diode 12. Further control of the characteristic impedance of the structure in FIG. 3 can be obtained by using a tapered dielectric (not shown) for layer 16, that is, one where W varies with R. Additionally, the characteristic impedance of the radial transmission line in FIG. 3 can be made independent of the radial position in the line by making W directly proportional to the radial position R. Furthermore, the outer diameter of the radial transmission line in FIG. 3 can also be varied in order to transform the low diode impedance to a selected higher value at the structure's periphery.

FIG. 4 illustrates the joining of a high impedance coaxial transmission line to the outer rim of the top conducting surface 16 of the radial transmission line of FIG. 3. The conductor making peripheral contact to the top conducting layer 16 is the center conductor 18 of a coaxial transmission line. This conductor 18 is machined to have a recessed or cavity portion 20 in the lower end thereof, so that only the outer peripheral region 22 of the center conductor 18 makes contact with the outer periphery of the upper conductive layer 16 of the radial transmission line. At this outer rim of the radial transmission line, the resistance of a mechanical contact is negligible when compared to the transformed diode impedance, and this assures good ohmic contact at the peripheral location 22 of the center coaxial conductor 18.

The outer coaxial conductor 24 is bonded as shown to the heat sink member 10, and the spacing between the inner and outer coaxial conductors 18 and 24 may be varied within limits to establish the characteristic impedance of this coaxial transmission line, which may typically be on the order of 50 ohms.

The effectiveness of our approach for making electrical contact to semiconductor diodes will be apparent after considering the design parameters associated with the large area double drift silicon IMPATT ring diode 12. This diode was designed to provide 70 watts of peak output power at a 10% duty cycle, and these parameters require a large area diode whose negative resistance is on the order of about −0.3 ohms. If an external circuit such as the coaxial line 18, 24 was connected directly to the diode 12, the impedance of the coaxial circuit at the point of contact with the diode 12 should be +0.3 for optimum circuit performance, and this impedance level would be very difficult if not impossible to achieve using the prior cylindrical λ/4 impedance transformer structures discussed above. On the other hand, if the novel impedance matching approach according to the present invention is utilized, and assuming a dielectric layer 14 with a thickness on the order of about 0.15 millimeters, a dielectric constant of 10, and an outer diameter of 7 millimeters, then the value required for the external circuit impedance at the point of contact 22 between the radial and coaxial transmission lines will be about 11.5 ohms, an impedance value much easier to achieve than the 0.3 ohms corresponding to the impedance of the diode 12. This behavior is illustrated in FIG. 5, which is an impedance versus frequency plot on a Smith chart, and this chart indicates the 11.5 ohm impedance at point 25 in FIG. 5 and appearing at the outer radius of the radial transmission line in FIG. 3.

Figure 6B:
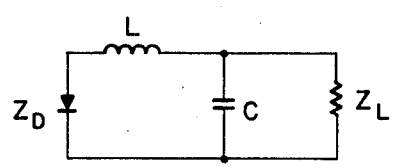
Figure 6C:
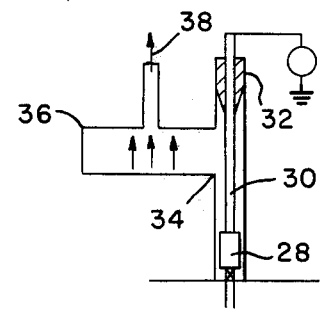
Figure 6A:
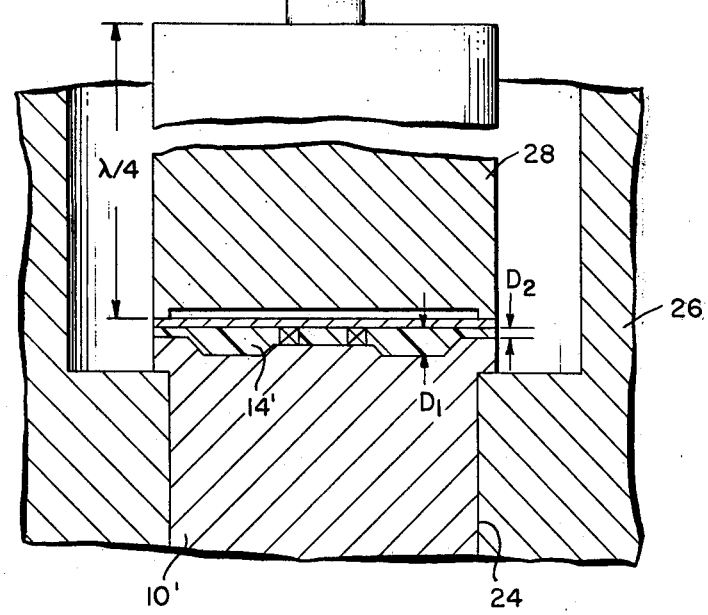
FIG. 6a illustrates another embodiment of the radial transmission line section according to the invention, with its dielectric layer being of variable thickness along the radius thereof.

Referring now to FIG. 6a, the radial transmission line shown therein differs from the structure of FIG. 3 in that the dielectric layer 14' varies in width along its radius. The particular geometry of the dielectric layer 14' is easy to achieve by merely contouring the upper surface of the heat sink 10' as shown, and preferably the heat sink 10' is securely mounted in an opening 26 in the outer conductor 24' of the coaxial transmission line. This particular heat sink mounting arrangement will be especially useful in power combiner circuitry, such as that shown in FIG. 6c.

Referring now to both FIGS. 6a and 6b, the dimension D1 of the dielectric layer 14' may be varied to control the equivalent circuit inductance parameter L, whereas the dimension D2 may be varied to control the capacitance parameter C in this equivalent circuit. In this manner the LC equivalent circuit between the diode impedance $Z_D$ and the load impedance $Z_L$ at the periphery of the radial transmission line can be controlled to optimize the circuit performance in accordance with several factors. First of all, the diode impedance $Z_D$ will be fixed for the particular annular ring diode selected, but other factors such as the allowable radius for the radial line (depending upon package requirements) and the impedance of the coaxial line 26, 28 will determine the optimum values of L and C for maximum efficiency and power transfer for a chosen operating frequency. As will be understood by those skilled in the art, the dimension D1 may be increased to increase the magnetic flux lines, and thus inductance L, along the radius of the radial transmission line. Similarly, the dimension D2 may be decreased to reduce the parallel plate capacitor spacing between the conductors of the radial transmission line, thereby increasing the capacitance value C.

For one X-band application of the circuit and structure according to the invention, we were able to decrease the overall diameter of the radial transmission line from 7 millimeters to 3 millimeters in going from the planar construction of FIG. 4 to the non-planar construction of FIG. 6a. Furthermore, the variable dimension characteristics of the radial line dielectric of FIG. 6a permit us to vary the parameter $Z_L$ in FIG. 6b within the range of 5–15 ohms, and this feature gives us significant flexibility in matching to the impedance of different types of coaxial transmission lines whose characteristic impedances may not be the same. But the 11.5 ohm value for $Z_L$ mentioned above permits us to match quite satisfactorily to a typical 50 ohm characteristic impedance coaxial line using a quarter wave impedance transformer which is readily available and which, in turn, may be coupled into another higher load in the range of 250–400 ohms.

Advantageously, the impedance transformer 28 in FIGS. 6a and 6c may be used to replace the solid metal cylindrical impedance transformer disclosed in the above identified Harp et al. U.S. Pat. No. 3,931,587. As described in that patent, a plurality of these coaxial electromagnetic circuits 30 including a ferrite termination element 32 may be positioned around the input port 34 of a common cylindrical power combining cavity 36 from which a combined power output signal is derived at an output probe 38. Further details of the operation of this type of power combining circuit are provided in the above identified Harp et al. U.S. Pat. No. 3,931,587.

Various modifications may be made to the above described embodiments without departing from the spirit and scope of this invention. For example, the waveguiding layers 14, 14' need not be a dielectric material and instead may be a high resistivity or semi-insulating semiconductive material having a resistivity in the range of $10^6$–$10^8$ ohm. centimeters. Furthermore, it would be possible within the scope of this invention to integrate the ring diode 12 using impurity diffusion or ion implantation of the like, directly into the intermediate semiconducting or semi-insulating wave-guiding layer of the radial transmission line of FIG. 3.

Additionally, the present invention is not limited to the positioning of a diode at the center of the radial transmission line, and would also cover a transmission line structure wherein the diode is spaced at the outer periphery of the radial transmission line. In this alternative structure, the center and outer conductors of an adjoining coaxial transmission line will be connected respectively to the first and second metal layer of the radial transmission line near or at the geometrical center thereof. In this alternative embodiment of the invention, the IMPATT diode construction may be either of a continuous annular configuration or it may instead utilize a plurality of individual semiconductor devices disposed around the outer periphery of the dielectric or semi-insulating waveguiding layer and there connected to the opposing surfaces of the first and second metal layers of the radial transmission line.

What is claimed:

1. An active transmission line structure for transforming the relatively low impedance of a semiconductor device to a high impedance suitable for coupling to external microwave circuitry, including, in combination:
   a. an active semiconductor device having an annular configuration with first and second opposed surfaces,
   b. a first metal layer adjacent said first device surface and extending radially therefrom,
   c. a second metal layer disposed on said second device surface and having a radial dimension which is substantially coextensive with a corresponding radial dimension of said first metal layer, and
   d. a non-conducting wave propagating material between said first and second metal layers and adjacent said semiconductor device, and forming with said first and second metal layers a radial transmission line for transforming the relatively low impedance of said semiconductor device to a predetermined higher impedance at a predetermined radial distance away from said semiconductor device, whereby said radial transmission line may be connected at or near its periphery to other higher impedance microwave circuits and with good impedance matching characteristics.

2. The structure defined in claim 1 wherein said nonconducting material between said first and second metal layers is substantially coplanar with said active semiconductor device.

3. The structure defined in claim 1 wherein said nonconducting material between said first and second metal layers varies in thickness by a chosen amount along the radius thereof, thereby establishing the inductance and capacitance values for said radial transmission line.

4. The structure defined in claim 1 wherein said nonconducting material between said first and second metal layers is selected from the group of materials consisting of dielectrics, semiconductors and semi-insulating materials.

5. The structure defined in claim 1 which further includes:
   a. a first conductor making electrical contact to said first metal layer at a predetermine distance from said semiconductor device, and
   b. a second conductor making electrical contact to said second metal layer at another predetermined distance from said semiconductor device, so that said first and second conductors form a coaxial transmission line which is impedance matched to the impedance of said radial transmission line, whereby semiconductor devices with relatively large areas and relatively high power and current handling capabilities, and corresponding low impedances, may be efficiently coupled for optimum power transfer to said coaxial transmission line having a relatively high characteristic impedance.

6. The structure defined in claim 1 wherein said semiconductor device is an IMPATT diode.

7. The structure defined in claim 5 wherein said semiconductor device is an IMPATT diode.

8. The structure defined in claim 5 wherein said first metal layer is a metal plated heat sink for supporting said semiconductor device and said second metal layer is a thin highly conductive metal film which makes good ohmic contact to said semiconductor device to thereby power losses at said ohmic contact.

9. The structure defined in claim 6 wherein said first metal layer is a metal plated heat sink for supporting said semiconductor device and said second metal layer is a thin highly conductive metal film which makes good ohmic contact to said semiconductor device to thereby minimize power losses at said ohmic contact.

10. The structure defined in claim 8 wherein said nonconducting material between said first and second metal layers is substantially coplanar with one surface of said semiconductor device.

11. The structure defined in claim 8 wherein said nonconducting material between said first and second metal layers varies in thickness by a predetermined amount along the radius thereof, thereby establishing the inductance and capacitance values of said radial transmission line.

12. The structure defined in claim 8 wherein said nonconducting wave propagating material between said first and second metal layers is selected from the group of materials consisting of dielectric materials, semi-insulating materials and high resistivity semiconductive materials.

13. A active transmission line structure for transforming the relatively low impedance of a semiconductor device to a higher impedance suitable for coupling to external microwave circuitry, including, in combination:
   a. an annular semiconductor device with first and second opposed surfaces,
   b. a first metal layer adjacent said first device surface and extending radially therefrom,
   c. a second metal layer disposed on said second device surface and having a radial dimension which is substantially coextensive with a corresponding radial dimension of said first metal layer, and
   d. a non-conducting wave propagating material between said first and second metal layers and adjacent said semiconductor device, and forming with said first and second metal layers a radial transmission line for transforming the relatively low impedance of said semiconductor device to a predetermined higher impedance at a predetermined radial distance away from said semiconductor device, whereby said radial transmission line may be connected at or near its periphery to other higher impedance microwave circuits and with good impedance matching characteristics.

14. The structure defined in claim 13 which further includes:
   a. first conductor making electrical contact to said first metal layer at a predetermind distance from said semiconductor device, and
   b. a second conductor making electrical contact to said second metal layer at another predetermined distance from said semiconductor device, so that said first and second conductors form a coaxial transmission line which is impedance matched to the impedance of said radial transmission line, whereby semiconductor devices with relatively large areas and relatively high power and current handling capabilities, and corresponding low impedances, may be efficiently coupled for optimum power transfer to said coaxial transmission line having a relatively high characteristic impedance.

15. The structure defined in claim 14, wherein said nonconducting wave propagating material between said first and second metal layers is selected from the group of materials consisting of dielectric materials, semi-insulating materials and high resistivity semiconductive materials.

16. The structure defined in claim 15 wherein said semiconductor device is an IMPATT diode.

* * * * *